United States Patent
Yasuda et al.

(10) Patent No.: US 7,230,747 B2
(45) Date of Patent: Jun. 12, 2007

(54) HOLOGRAM RETENTION METHOD

(75) Inventors: Shin Yasuda, Ashigarakami-gun (JP); Katsunori Kawano, Ashigarakami-gun (JP); Jiro Minabe, Ashigarakami-gun (JP); Tatsuya Maruyama, Minato-ku (JP); Norie Matsui, Ashigarakami-gun (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 10/799,659

(22) Filed: Mar. 15, 2004

(65) Prior Publication Data

US 2005/0041270 A1 Feb. 24, 2005

(30) Foreign Application Priority Data

Aug. 21, 2003 (JP) .............................. 2003-297199

(51) Int. Cl.
 *G03H 1/20* (2006.01)
 *G03H 1/04* (2006.01)
 *G03H 2/22* (2006.01)
(52) U.S. Cl. .................... 359/12; 359/35; 359/32; 430/1
(58) Field of Classification Search ................. 359/3, 359/12, 21, 22, 24, 30, 29, 35, 10, 11, 32; 369/110.01, 112; 430/1, 2; 350/32
See application file for complete search history.

(56) References Cited

U.S. PATENT DOCUMENTS

| | | | | |
|---|---|---|---|---|
| 5,016,953 A * | 5/1991 | Moss et al. | ..................... | 359/9 |
| 6,377,367 B1 * | 4/2002 | Suganuma | ..................... | 359/1 |
| 6,452,890 B2 * | 9/2002 | Kawano et al. | ......... | 369/110.01 |
| 6,707,585 B2 * | 3/2004 | Tanaka | ......................... | 359/35 |
| 6,806,982 B2 * | 10/2004 | Newswanger et al. | ........ | 359/35 |

FOREIGN PATENT DOCUMENTS

| JP | A 10-340479 | 12/1998 |
|---|---|---|
| JP | A 2003-126692 | 5/2003 |

OTHER PUBLICATIONS

Tsujioka, Tsuyoshi et al. "Superlow-Power Readout Characteristics of Photochromic Memory." *Jpn. Journal Of Appl. Physics* vol. 34 Part 1, No. 12A Dec. 1995, pp. 6439-6443.

* cited by examiner

*Primary Examiner*—Audrey Chang
(74) *Attorney, Agent, or Firm*—Oliff & Berridge, PLC

(57) ABSTRACT

Information recorded as a hologram in a predetermined position of an optical recording medium is reproduced, and subsequently the reproduced information is re-recorded and retained in the same position as the predetermined position as a hologram. Alternatively, information recorded as a hologram in a predetermined position of an optical recording medium is reproduced, and subsequently the reproduced information is re-recorded and retained in a position different from the predetermined position as a hologram easily.

14 Claims, 14 Drawing Sheets

VOLUME MULTIPLEXING
IS MADE POSSIBLE BY ROTATION OF DISK

BOTH DETECTOR AND EXPOSURE SCHEDULE ARE THE SAME

DETECTOR IS DIFFERENT AND EXPOSURE SCHEDULE IS THE SAME

SPHERICAL REFERENCE BEAM
RECORDING MEDIUM RECORDING

SPHERICAL REFERENCE BEAM
RECONSTRUCTED BEAM
RECORDING MEDIUM REPRODUCTION

SPHERICAL REFERENCE BEAM
RECORDING MEDIUM RE-RECORDING

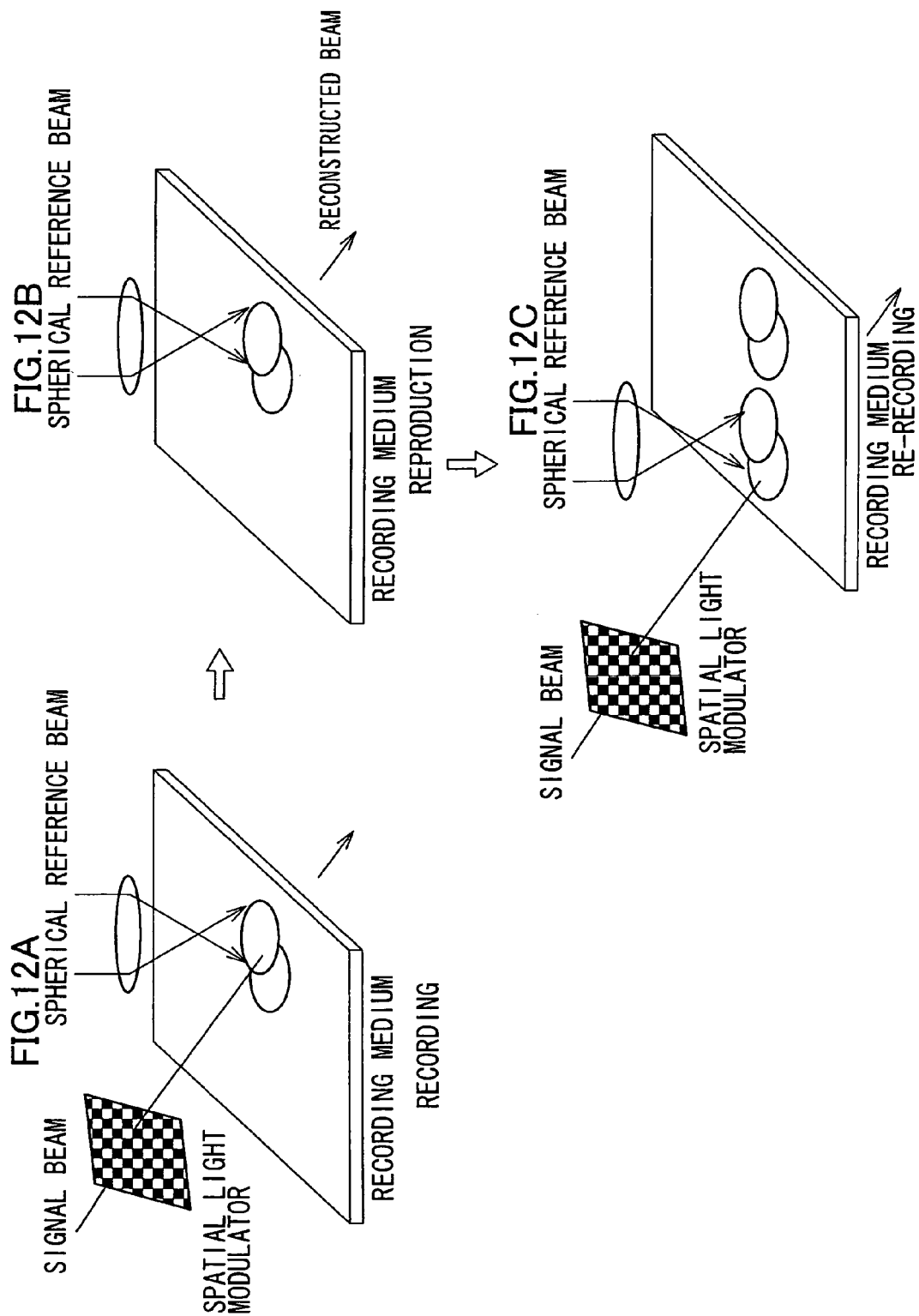

HOLOGRAM RETENTION METHOD

CROSS-REFERENCE TO RELATED APPLICATION

This application claims priority under 35USC 119 from Japanese Patent Application No. 2003-297199, the disclosure of which is incorporated by reference herein.

BACKGROUND OF THE INVENTION

1. Field of the Invention

The present invention relates to a hologram retention method, and in particular to a hologram retention method for stably retaining data recorded on a rewritable optical recording medium.

2. Description of the Prior Art

As a computer file memory of the next generation, a holographic memory having both a large capacity property resulting from a three-dimensional recording region and a high speed property resulting from a two-dimensional batch recording and reproduction scheme is attracting attention. In the holographic memory, a plurality of data pages can be multiplexed and recorded in the same volume, and the data of each page can be batch-read. By digitizing binary digital data "0, 1" as "bright, dark" instead of an analog image, and recording and reconstructing them as a hologram, recording and reproduction of digital data also become possible. Recently, proposals have been made as regards the signal-to-noise ratio, bit error rate estimation, and two-dimensional encoding based on the specific optical system and the volume multiplexing method. Studies from a more optical viewpoint, such as the influence of aberration in the optical system are also advancing.

With reference to FIGS. 5A and 5B, a shift multiplexing method, which is an example of the volume multiplexing method, will now be described. In this shift multiplexing method, a light wave having a wave surface that changes steeply, such as a spherical wave or a speckle pattern, is used as a reference beam. In the case where such a reference beam is used, the Bragg condition for reproduction can be dissatisfied by only deviating the position of the recording medium slightly from a recording spot by a shift quantity $\delta$ (FIG. 5B), and a new hologram can be recorded there. In other words, by conducting recording while slightly moving the recording medium, holograms can be multiplexed in nearly the same volume. As heretofore described, in the digital holographic storage, high speed transfer owing to the two-dimensional batch recording and reproduction and capacity increase owing to the volume recording can be implemented simultaneously.

As the medium materials for the holographic memory, photopolymer materials, photorefractive materials, azobenzen-containing polymer (azopolymer) materials, and so on are being studied extensively. Among them, in recording media using a photorefractive material or a photochromic material such as an azopolymer material, it is possible to erase recorded data and record new data. Since in these rewritable type recording media repetitive recording is possible, their use as backup memories such as hard disks besides information storage of large capacity is also greatly anticipated.

In the recording media using the photorefractive material or the photochromic material, however, there is a problem that the hologram is degraded by exposure to the light at the time of hologram reproduction. In other words, if a beam having the same wavelength as that used at the time of recording is used as the read-out beam, whenever the reproduction is conducted, diffraction efficiency of the hologram reduces, so that the bit error rate (BER) of the reproduced data increases. As a result, it becomes impossible to normally retrieve data recorded as the hologram.

In order to avoid this problem, a method of lowering the intensity of the read-out beam at the time of reproduction and reducing to the utmost the degree of hologram degradation caused by exposure to light at the time of reproduction has been proposed (Jpn. J. Appl. Phys., 34 (1995) 6439).

If the intensity of the read-out beam is lowered, however, the intensity of the reconstructed beam also falls and the BER in information readout increases. Furthermore, in general, there is no threshold in beam intensity causing photoreaction in the photochromic materials and the photorefractive materials. Even if a very weak read-out beam is used, therefore, a change occurs in recorded information. Accordingly, it is difficult to read out information from the recording medium without destroying the information. In other words, even if a very weak read-out beam is used, destruction of recorded information advances as the number of times of reading information recorded in the same volume increases.

SUMMARY OF THE INVENTION

In order to solve the above-described problems, the present invention has been achieved. An object of the invention is to provide a hologram retention method capable of stably retaining and reproducing data recorded as a hologram.

In order to achieve the object, a first hologram retention method according to the invention includes the steps of reproducing information recorded as a hologram in a predetermined position of an optical recording medium, and subsequently re-recording and retaining the reproduced information in the same position as the predetermined position as a hologram. A second hologram retention method according to the invention includes the steps of reproducing information recorded in a predetermined position of an optical recording medium, and subsequently re-recording and retaining the reproduced information in a position different from the predetermined position as a hologram.

In the hologram retention method according to the invention, the reproduced information is re-recorded and retained as a hologram. Therefore, it is avoided that the hologram cannot be read by repeating the reproduction, and data recorded as the hologram can be retained and reproduced stably. Therefore, the hologram retention method is especially effective when retaining information in an optical recording medium in which holograms are degraded by exposure at the time of reproduction, such as an optical recording medium using a photochromic material or a photorefractive material.

The position in which the reproduced information is recorded may be the same position as the predetermined position in which the original information has been recorded, or may be a position different from the predetermined position. In the case where the reproduced information is re-recorded in the same position as the predetermined position, it is preferable to re-record the reproduced information so as to obtain a suitable reconstructed beam intensity whereby a sufficiently small BER can be obtained, by, for example, altering the exposure time for exposing the optical recording medium. Alternatively, it is preferable to re-record the reproduced information so as to cause a polarization state of a reconstructed beam obtained from a re-recorded hologram to be different from a polarization state of a reconstructed beam obtained from a hologram before re-recording. In the case where the reproduced information is re-recorded in a position different from the pre-determined position, it is preferable that record position information representing a position in which information has been recorded is also recorded.

The re-recording of the recorded information may be conducted when the intensity of the reconstructed beam has fallen to a predetermined value or less, or may be conducted when the number of times of reproduction has exceeded a predetermined value. It is also possible to re-record the recorded information whenever the recorded information is reproduced.

When dividing information of a file unit into a plurality of blocks and multiplex-recording the information in an optical recording medium as holograms of a plurality of pages every block, it is preferable to reproduce the information of the file unit and subsequently re-record and retain the reproduced file so as to re-divide the reproduced file into a smaller number of blocks. By thus executing the so-called defragmentation and eliminating fragmentation, it is possible to prevent the file retrieval speed from falling.

As the method for multiplex-recording, there are an angular multiplexing method including the steps of applying a signal beam and a reference beam simultaneously to the optical recording medium while changing an angle formed by the signal beam and the reference beam and thereby changing a recording angle, and multiplex-recording the information of the signal beam in the optical recording medium as holograms of a plurality of pages; a shift multiplexing method including the steps of making an angle formed by the signal beam and the reference beam constant, applying a signal beam and a reference beam simultaneously to the optical recording medium while relatively moving at least one of the signal beam and the reference beam, and the optical recording medium, and thereby changing a recording position, and multiplex-recording the information of the signal beam in the optical recording medium as holograms of a plurality of pages; a wavelength multiplexing method including the steps of making an angle formed by the signal beam and the reference beam constant, applying a signal beam and a reference beam simultaneously to the optical recording medium while changing a wavelength of the reference beam and the signal beam by a predetermined wavelength $\Delta\lambda$, and multiplex-recording the information of the signal beam in the hologram optical recording medium as holograms of a plurality of pages, and a phase multiplexing method including the steps of making an angle formed by the signal beam and the reference beam constant, applying a signal beam and a reference beam simultaneously to the optical recording medium while changing a phase of the reference beam, and multiplex-recording the information of the signal beam in the hologram optical recording medium as holograms of a plurality of pages.

As heretofore described, the invention brings about an effect that data recorded as the hologram can be retained and reproduced stably.

BRIEF DESCRIPTION OF THE DRAWINGS

FIGS. 12A to 12C are diagrams of assistance in explaining a method for conducting re-recording in a position different from that in which a reproduced hologram has been recorded.

DETAILED DESCRIPTION OF THE INVENTION

Hereafter, a hologram recording and reproduction apparatus for recording and reproducing holograms by using a hologram retention method according to the present invention will be described in detail with reference to the drawings.

Figure 1:
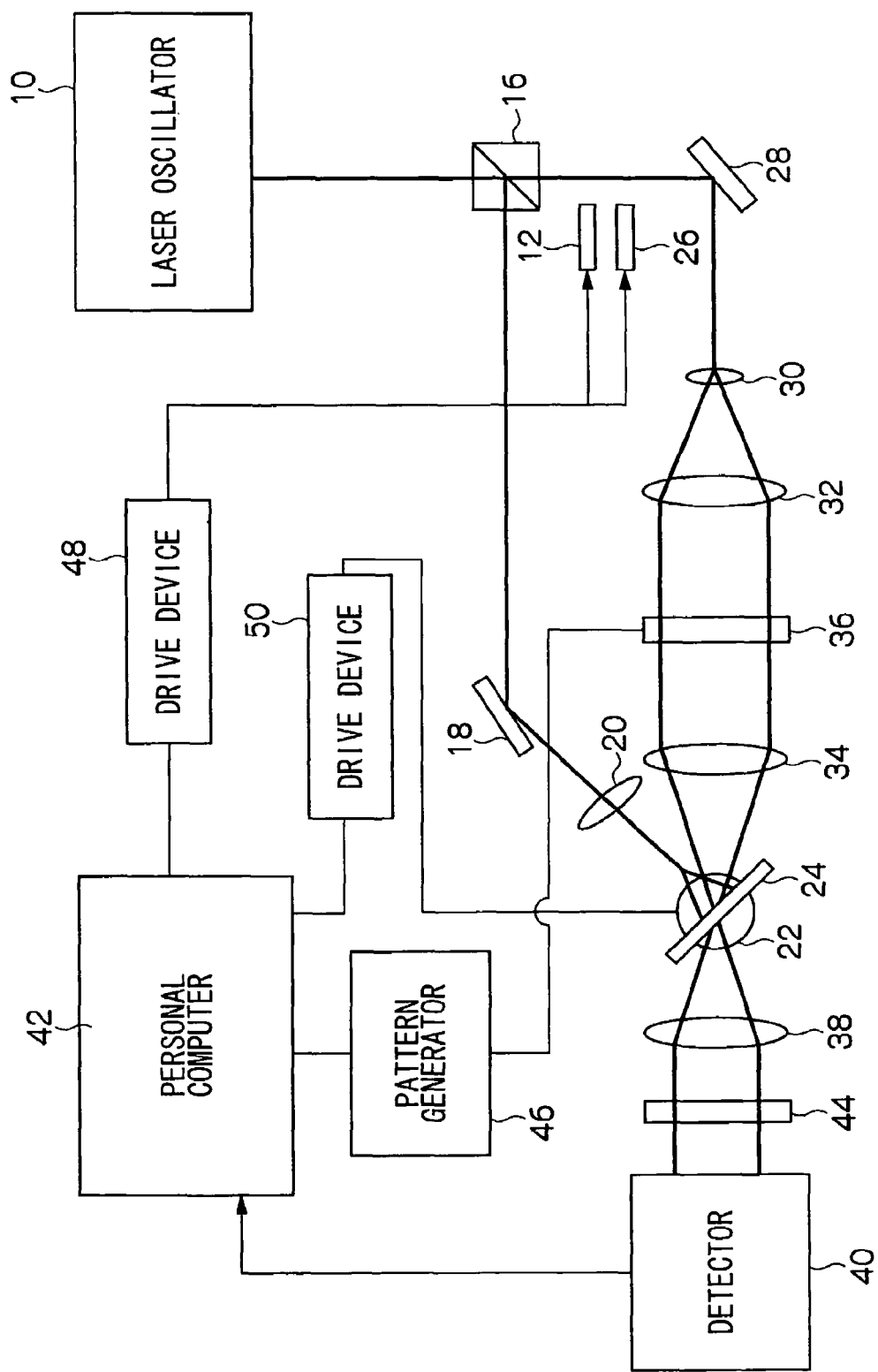
FIG. 1 is a schematic diagram of a hologram recording and reproduction apparatus according to an embodiment of the present invention.

As shown in FIG. 1, a laser oscillator 10 using, for example, a Nd:YVO4 crystal is provided in a hologram recording and reproduction apparatus of the present embodiment. A laser beam having a wavelength of 532 nm, which is coherent light, is oscillated in the laser oscillator 10, and used for irradiation. On a laser light irradiation side of the laser oscillator 10, a polarization beam splitter 16 for separating the laser light into two kinds of light, i.e., light for reference beam and light for signal beam by transmitting p-polarized light and reflecting s-polarized light.

On a beam reflection side of the polarization beam splitter 16, a reflecting mirror 18 for reflecting the laser light for reference beam and altering the optical path to a direction of a hologram recording medium, and an objective lens 20 for focusing the laser light for reference beam and generating a reference beam formed of a spherical reference wave are disposed in the cited order. On a laser light focusing side of the objective lens 20, an x-z stage 22 including a stepping motor to rotate a hologram recording medium 24 formed in a disk form in a z-plane is provided. The objective lens 20 applies the s-polarized light, which is the spherical reference wave, to the hologram recording medium 24 as the reference beam.

On a beam transmission side of the polarization beam splitter 16, a shutter 12 for cutting off the p-polarized light transmitted by the polarization beam splitter 16 and an optical rotator 26 for rotating a plane of polarization at 90° are disposed so as to be separately capable of being inserted in the optical path or shunted. On a beam transmission side of the optical rotator 26, a reflecting mirror 28 for reflecting the laser light for signal beam at a reflection angle of 45° and altering the optical path to a direction of the recording medium, and a lens system including lenses 30, 32 and 34 are disposed in the cited order. Between the lens 32 and the lens 34, a transmission type spatial light modulator 36 including a liquid crystal display element is disposed to modulate the laser light for signal beam according to a supplied recording signal for each page and generate a signal beam for recording pages of holograms.

The lenses 30 and 32 collimate the laser light into a beam having a large diameter, and apply the resultant beam to the spatial light modulator 36. The lens 34 focuses the p-polarized light modulated by the spatial light modulator 36 and transmitted onto the hologram recording medium 24 as the signal beam. At this time, focusing is conducted so as to make a irradiating spot of the signal beam smaller than a irradiating spot of the reference beam. The signal beam and the reference beam are simultaneously applied to the hologram recording beam 24. Furthermore, since the p-polarized light is used as the signal beam and the s-polarized light is used as the reference beam, the polarization direction of the signal beam and the polarization direction of the reference beam are perpendicular to each other when recording pages of the holograms. By the way, the s-polarized light may be used as the signal beam and the p-polarized light may be used as the reference beam. A signal beam and a reference beam having parallel planes of polarization may also be used. Circularly polarized beams that rotate in different directions may be used as the signal beam and the reference beam.

On a reconstructed beam transmission side of the hologram recording medium 24, a lens 38, an analyzer 44 for selecting light in a predetermined polarization direction (such as a 0° polarization component, a 45° polarization component or a 90° polarization component) from the reconstructed beam and transmitting the selected beam, and a photo-detector 40 including an image pickup element such as a CCD camera to convert received reconstructed beam to an electric signal and output the electric signal are disposed. The photo-detector 40 is connected to a personal computer 42.

The personal computer 42 includes a CPU, a ROM, a RAM, a memory and so on. The personal computer 42 is connected to input-output units, such as a display or a keyboard, which are not illustrated. The personal computer 42 is connected to the spatial light modulator 36 via a pattern generator 46, which generates a pattern according to a recording signal supplied from the personal computer at predetermined timing. Furthermore, a drive unit 48 is connected to the personal computer 42 to drive the shutter 12 and the optical rotator 26 so as to separately insert them in the optical path and separately shunt them from the optical path. Furthermore, a drive unit 50 is connected to the personal computer 42 to drive the x-z stage 22.

Figure 2A:
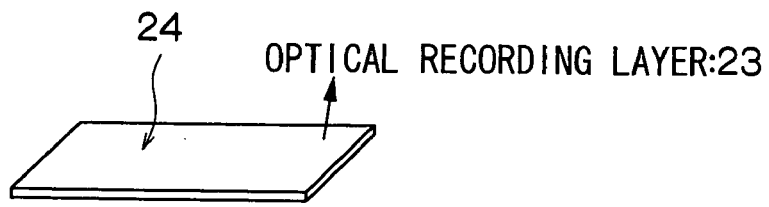
FIGS. 2A to 2C are schematic illustrations showing a configuration of a hologram recording medium.
Figure 2B:
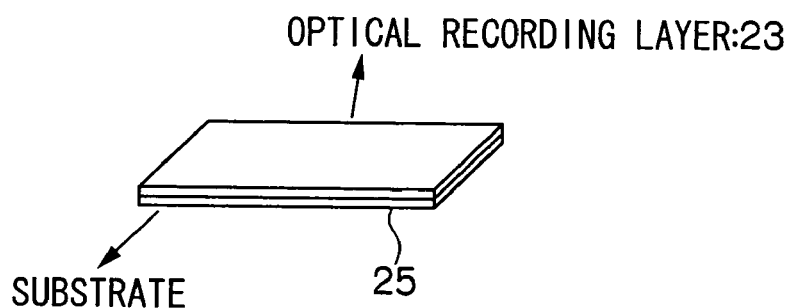
Figure 2C:
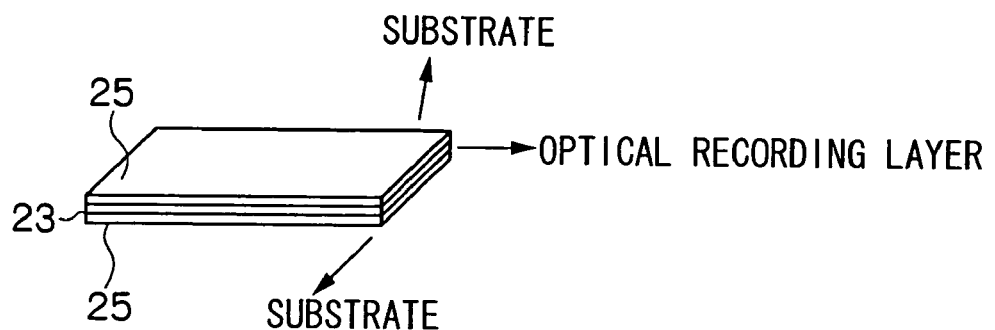

A configuration of the hologram recording medium (optical recording medium) 24 is shown in FIG. 2. Although the hologram recording medium of the present embodiment is formed so as to take the shape of a disk, a part obtained by cutting out the disk in a rectangular form is shown in FIG. 2. As shown in FIG. 2A, the hologram recording medium 24 includes an optical recording layer 23 formed so as to take the shape of a thick film having a thickness of, for example, at least 100 µm. If the strength is insufficient with the optical recording layer alone, a boardlike substrate 25 made of a transparent medium such as quartz glasses or plastics is provided on one side or both sides as shown in FIG. 2B or 2C.

The optical recording layer 23, i.e., the photosensitive layer exhibits a photo-induced refractive index change or a photo-induced dichroism. Any material can be used, so long as it is a photorefractive material or a polarization sensitive material in which the photoinduced refractive index change or the photoinduced dichroism is maintained at the normal temperature. However, a macromolecule having a photoisomerized group in its side chain, such as at least one kind of polymer selected from a polyester group, having a photoisomerized group in the side chain, such as azobenzene frame, is suitable.

The principle of photoinduced birefringence will now be described by taking azobenzene as an example. In response to light irradiation, azobenzene repeats an isomerization cycle of "trans-cis-trans." Before light irradiation, a large number of azobenzene molecules of trans-form exist in the optical recording layer. These molecules are oriented at random, and macroscopically isotropic. If linearly polarized light is applied, azobenzene molecules having an absorption axis in the same direction as the polarization direction are selectively trans-cis-isomerized. Molecules relaxed to a trans-form having an absorption axis perpendicular to the polarization direction do not absorb light any longer and they are fixed to that state. As a result, macroscopically anisotropy in absorption coefficient and refractive index, i.e., dichroism and birefringence are induced. In the macromolecule including such a photoisomerized group, the orientation of the macromolecule itself is also changed by photoisomerization and large birefringence can be induced. The birefringence thus induced is stable at a temperature lower than the glass transition temperature, and suitable to record pages of the holograms.

Polyester having cyanoazobenzene in the side chain represented by the following chemical formula (see Japanese Patent Application Laid-Open (JP-A) No. 10-340479) is suitable as a material for recording the hologram according to the above-described mechanism. The polyester can record the polarization direction of the signal beam as the hologram, owing to the photoinduced anisotropy caused by photoisomerization of cyanoazobenzene in the side chain. The hologram can be recorded at the normal temperature, and the recorded hologram can be maintained semipermanently, unless erasure beam is applied.

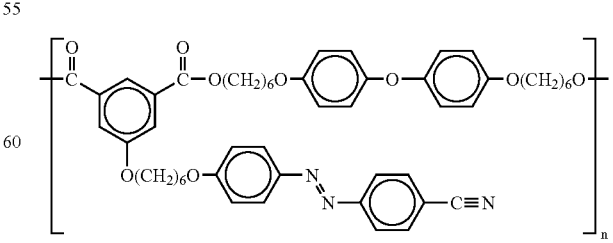

In addition, for the purpose of, for example, adjusting the transmittance of light, polymer blend obtained by mixing a polymer including a photosensitive group, i.e., a photoisomerized group such as azobenzene frame and a polymer in which absorption of recording beam is low can also be used. Alternatively, a copolymer obtained from a monomer that includes a photosensitive group such as azobenzene frame and a monomer in which absorption of the recording beam is low can also be used. For example, a polymer blend including polymers of two kinds respectively represented by the following chemical formulas (1) and (2) (see Japanese Patent Application No. 2003-126692) can be used. When using a thick recording film, optical absorption in the medium increases as the film thickness increases. For the purpose of, for example, adjusting the optical absorptivity of the medium, the mixture ratio is suitably set. As a result, it becomes possible to record the hologram favorably in the volume of the recording medium.

tion unit, which is not illustrated, and selects either hologram recording processing or hologram reproduction processing. In the case where a file is recorded as holograms of a plurality of pages, previously the file is input to the personal computer and a recording signal is generated for each of the pages.

At step 100, it is determined whether the hologram recording processing has been selected or the hologram reproduction processing has been selected. If the hologram recording processing has been selected, computation of an exposure schedule is conducted according to the number of pages in the file at step 102. The computed exposure schedule is stored in the memory.

Denoting the number of pages in a file, i.e., the number of multiplexed holograms of the file by M, an exposure time tN

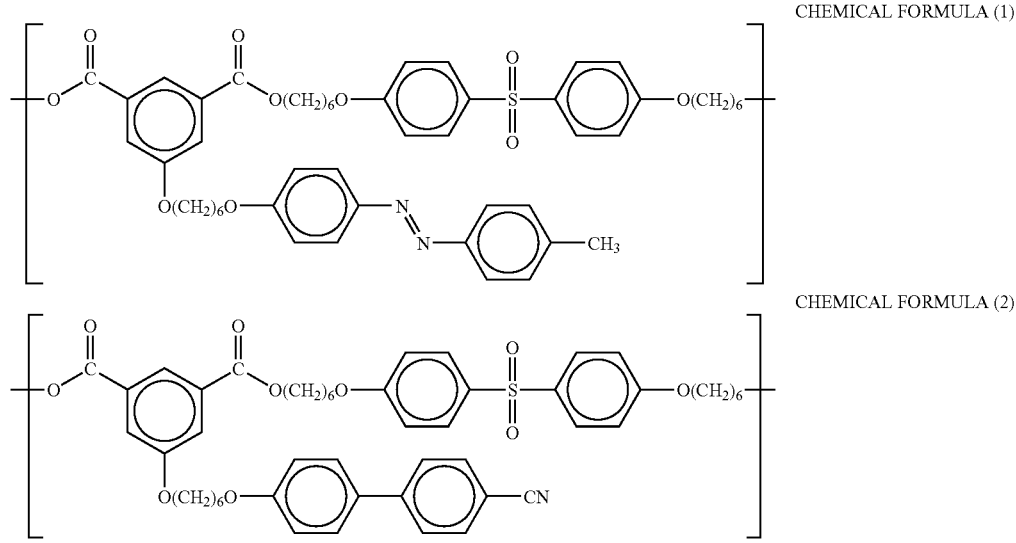

CHEMICAL FORMULA (1)

CHEMICAL FORMULA (2)

Figure 3:
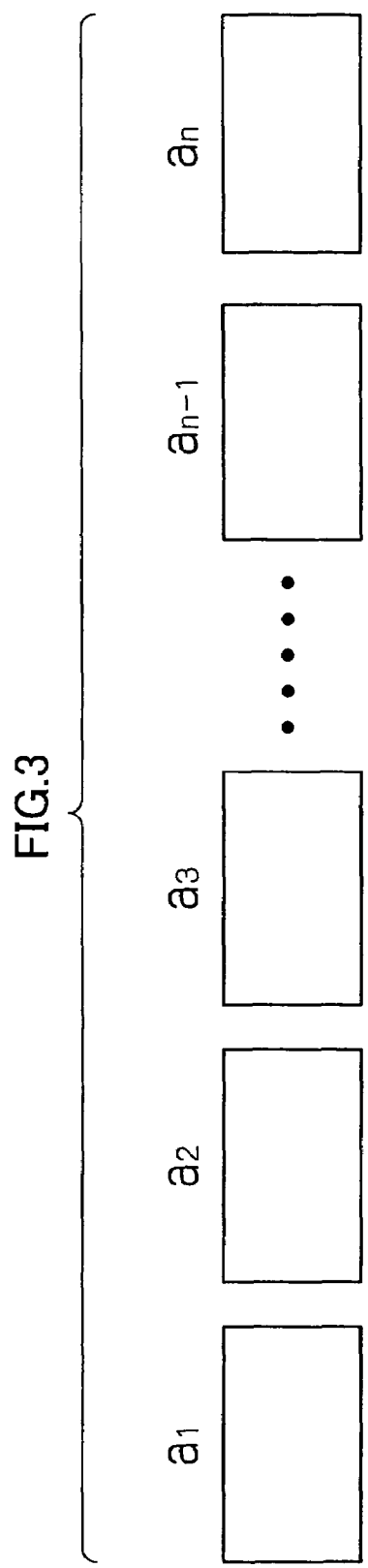
FIG. 3 is a concept diagram showing recording regions disposed in an optical recording layer of a hologram recording medium.

Furthermore, in the disklike hologram recording medium 24, a plurality of recording tracks are arranged concentrically on the optical recording layer 23. As shown in FIG. 3, the recording tracks are divided into a large number of recording regions "$a_1$" to "$a_n$". In the present embodiment, the recording regions "$a_1$" to "$a_n$" have equal capacities. Data recording or reconstruction is conducted by taking a recording region obtained by the division as the unit. By the way, the recording regions "$a_1$" to "$a_n$" may have different capacities, and data recording or reconstruction may be conducted by taking a plurality of recording regions division as the unit.

A part of the large number of recording regions is used to record directory information, such as a file name of recorded data, update date and hour, a file size and a recording region. Another part of the large number of recording regions is used to record a file allocation table (FAT), which associates each of recorded files with a recording region in which the file has been recorded. On the basis of allocation information obtained by referring to the directory information and the FAT, the use situation of the recording regions can be grasped.

Figure 4:
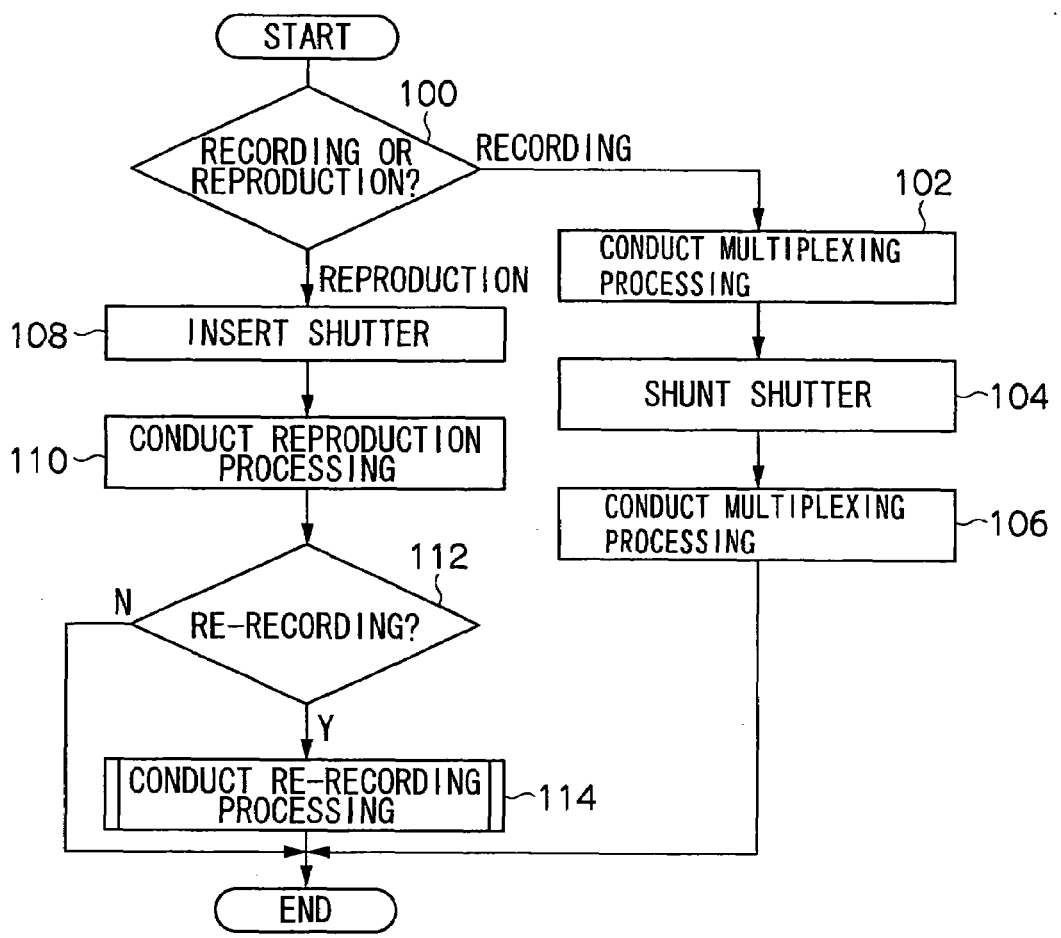
FIG. 4 is a flowchart showing a hologram recording and reproduction processing routine in an embodiment of the present invention.
Figure 5A:
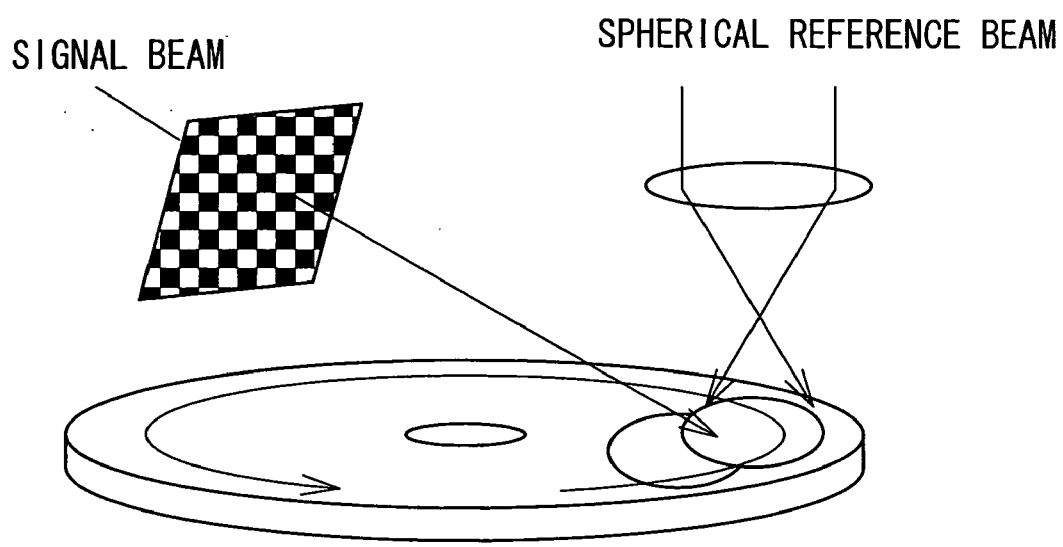
FIGS. 5A and 5B are diagrams of assistance in explaining a shift multiplexing method.
Figure 5B:
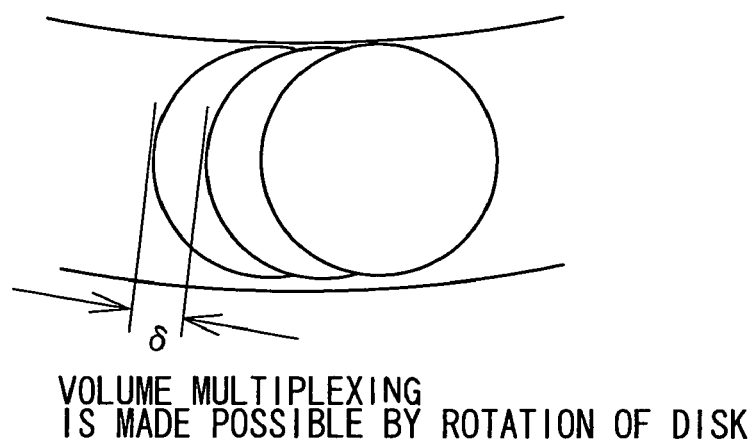

With reference to FIG. 4, a recording and reproduction processing routine executed by the personal computer 42 will now be described. First, an operator operates an operasecond during which an Nth page of the file is exposed can be found by, for example, the following equation.

$$t_N = A\exp(-B(N-M))$$

Here, A and B are constants. The constant A can be made equal to a value of an exposure time (second) for obtaining an diffraction efficiency required for reproduction from the hologram of the final page. For shortening the exposure time, the constant A is desired to be as small as possible. The constant B is set according to the characteristics of the recording medium and the intensity of the recording beam so as to make the dispersion in diffraction efficiency among pages smaller. In the case where a recording beam having a beam intensity of 220 mW/cm$^2$ is used for a polymer blend including the macromolecule compound represented by the chemical formula (1) at 50% by weight in the macromolecule compound represented by the chemical formula (2), for example, the exposure time tN can be represented by the following equation.

$$t_N = 0.25\exp(-0.09(N-M))$$

By the way, system design with due regard to the variation of the diffraction efficiency at the time of re-recording will be described later.

At step 104, the drive unit 48 is driven to shunt the shutter 12 from the optical path and pass the laser light. In addition, the stepping motor of the x-z stage 22 is driven by the drive unit 50 to rotate the hologram recording medium at a predetermined rotation speed.

At step 106, laser light is applied. In addition, a recording signal of each page is output from the personal computer 42 at predetermined timing according to the exposure schedule. Shift multiplexing processing of the hologram onto the hologram recording medium is executed, and the processing routine is finished. The p-polarized light transmitted by the polarization beam splitter 16 is modulated by the spatial light modulator 36 and applied to the hologram recording medium 24 as the signal beam. On the other hand, the s-polarized light reflected by the polarization beam splitter 16 is applied to the hologram recording medium 24 as the reference beam.

In the shift multiplexing method of the present embodiment, a spherical wave is used as the reference beam and the hologram recording material is formed to take the shape of a disk. By rotating the disk-shaped hologram recording medium (disk), shift multiplexing is conducted. In this shift multiplexing method, holograms of a pluralities of pages can be recorded in the same region one over the other by the rotation of the disk. If the wavelength of the laser light, the film thickness of the recording medium, and NA of the objective lens are set suitably, it is possible to record the hologram of the next page in nearly the same region and reproduce the hologram without crosstalk from an already recorded page, by only rotating the disk so as to move the recording position by several tens μm in order to record the hologram of the next page. This utilize the fact that a shift of the disklike hologram recording medium (movement of several tens μm) is equivalent to a change of an incident angle of the reference beam because the reference beam is a spherical wave.

A shift quantity of the disklike hologram recording medium in the shift multiplexing using the spherical reference wave, i.e., such a distance δspherical that holograms can be separated independently is given by the following equation (1).

$$\delta_{spherical} = \delta_{Bragg} + \delta_{NA} \approx \frac{\lambda z_0}{L \tan \theta_S} + \frac{\lambda}{2(NA)} \quad (1)$$

Here, $\lambda$ is a wavelength of laser light, z0 a distance between the objective lens for generating the spherical reference wave and the hologram recording medium seen from within the recording medium, L a film thickness of a hologram recording medium, NA a numerical aperture of the objective lens, θs an angle formed by the signal beam with the reference beam in the recording medium. As the thickness L of the hologram recording medium becomes large, the shift quantity δ determined by the distance over which holograms can be separated independently becomes small according to the equation (1), and consequently the number of multiplexed holograms can be increased and the recording capacity can be increased.

In a state in which the hologram recording medium has been rotated, the personal computer supplies recording signals of respective pages to the spatial light modulator 36 at timing determined so as to record respective pages of the holograms at intervals of the shift quantity δ from the recording start position.

In the present embodiment, the signal beam is Fourier transformed by a lens and applied to the hologram recording medium serving as the recording medium, in the same way as ordinary digital holographic storages. By using the lens, a relatively strong beam intensity can be obtained on the surface of the hologram recording medium. If at this time the distance between the Fourier transform lens and the hologram recording medium is made equal to the focal length, a Fourier transform hologram is recorded. In general, hologram recording is conducted with the recording medium slightly shifted from the focus position of the lens, for the purpose of suppressing the intensity of 0th diffracted light of the signal beam on the recording surface.

Figure 6:
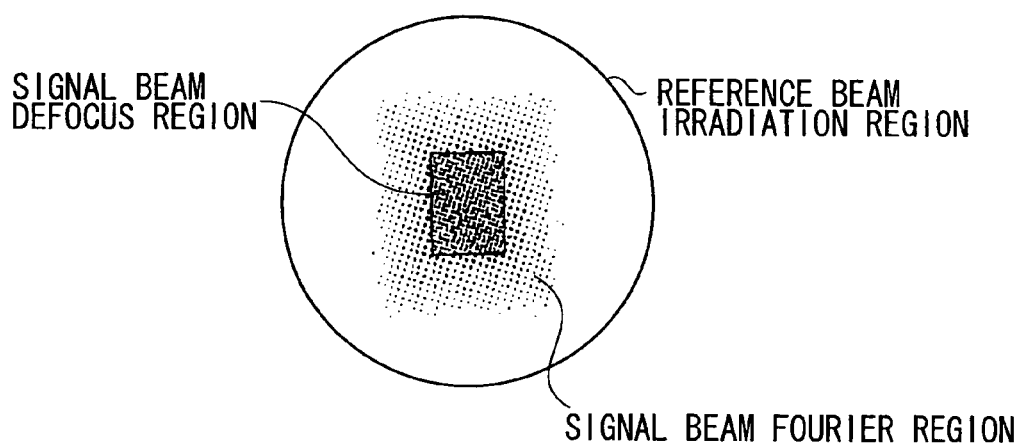
FIG. 6 is a schematic illustration showing a relation between a signal beam irradiation region and a reference beam irradiation region.

FIG. 6 is a schematic illustration showing hologram recording in the defocus position. On the hologram recording medium surface, the signal beam is focused by the lens to some degree, and a diffraction pattern of the data page appears. This diffraction pattern corresponds to a (periodic) pattern of digital data pages. When the digital data page has a random pattern, the spread is the widest.

On the other hand, the reference beam is applied to a wider region as compared with the irradiation region of the diffraction pattern of the signal beam, so as to cover all of the diffraction pattern. In a place where beams intensify each other by interference between the signal beam and the reference beam, a change in refractive index or absorption occurs. In a place where beams weaken each other, the change is small. By using this phenomenon, hologram recording of respective pages is conducted.

Figure 7:
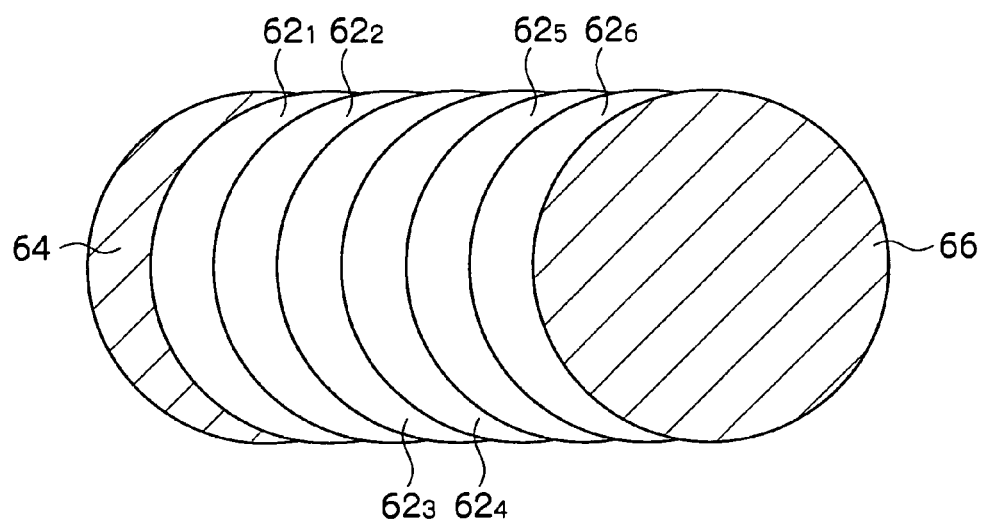
FIG. 7 is a diagram showing a recording state of a multiplex-recorded holograms.

By the shift multiplexing processing heretofore described, holograms of a plurality of pages are multiplexed for each file. For example, in the case where a file is recorded as holograms $62_1$ to $62_6$ of six pages as shown in FIG. 7, holograms of a total of eight pages, which includes a hologram 64 having information representing the top page recorded therein and a hologram 66 having information representing the final page recorded therein, are multiplexed.

If the hologram reproduction processing is judged at step 100 to have been selected, the shutter 12 is inserted in the optical path at step 108, and hologram reproduction processing is executed at step 110. As a result of the insertion of the shutter 12 in the optical path, the laser beam transmitted by the polarization beam splitter 16 is intercepted by the shutter 12. Therefore, only the reference beam is applied to the hologram recording medium 24 having holograms recorded therein. The reconstructed beam diffracted by the hologram recording medium 24 is transmitted by the lens 38. Only the predetermined polarization component of a reconstructed beam is selected and transmitted by the analyzer 44. The reconstructed beam received by the photo-detector 40 is converted to an electric signal by the photo-detector 40. The electric signal is input to the personal computer 42, and then decoded by a decoder, which is not illustrated. Original digital data is thus restored.

At step 112, a decision whether to conduct re-recording is made. The decision whether to conduct re-recording can be made by, for example, previously setting a threshold (a lower limit value) with respect to the intensity of the reconstructed beam detected by the photo-detector 40 and determining whether the intensity of the reconstructed beam has become equal to the threshold or less. The threshold is determined on the basis of the sensitivity of the photo-detector 40 and the minimum signal-to-noise ratio of the reconstructed beam required for data reproduction. For example, the intensity of the reconstructed beam obtained when the BER of the reproduced data has exceeded a permitted limit value (such as $10^{-3}$) can be used as the threshold.

In the case where the number of times of reproduction for which the intensity of the reconstructed beam becomes equal to the threshold or less is known, it is also possible to record the number of times of reproduction on the optical recording medium and determine whether to conduct re-recording on the basis of the recorded number of times of reproduction. Although in the present embodiment it is determined whether to conduct re-recording, re-recording may be conducted whenever reproduction is performed.

Figure 8:
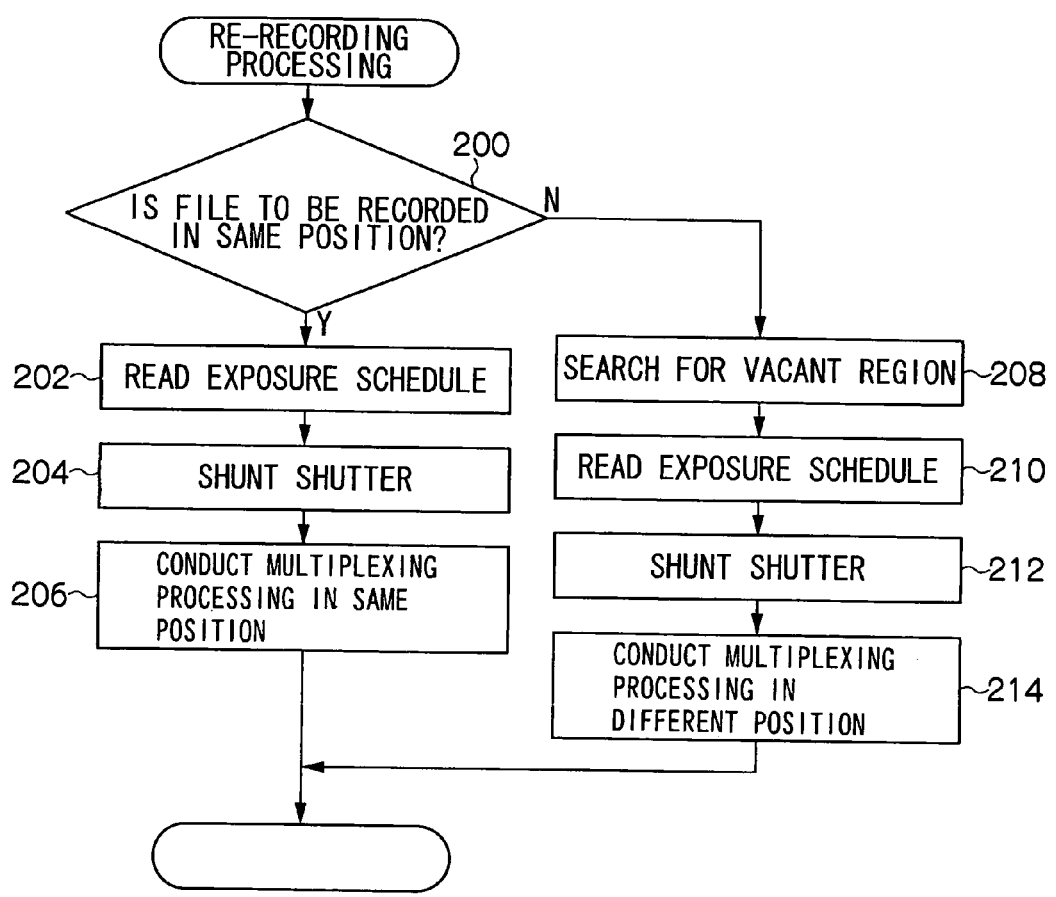
FIG. 8 is a flowchart showing a subroutine of re-recording processing.

If it is determined at the step 112 that re-recording should not be conducted, the processing routine is finished. On the other hand, if it is determined at the step 112 that re-recording should be conducted, a subroutine for hologram re-recording processing is executed at step 114. The re-recording processing subroutine will now be described with reference to FIG. 8.

At step 200, a decision whether to re-record the reproduced file in the same position is made. The decision whether to re-record the reproduced file in the same position is made on the basis of, for example, whether defragmentation is executed. In the case where the reproduced file is re-recorded in the same position, the exposure schedule is read out from the memory at step 202, and the drive unit 48 is driven to shunt the shutter 12 from the optical path so as to pass the laser beam at step 104. In addition, the stepping motor for the x-z stage 22 is driven by the drive unit 50 to rotate the hologram recording medium at the predetermined rotation speed.

Figure 11A:
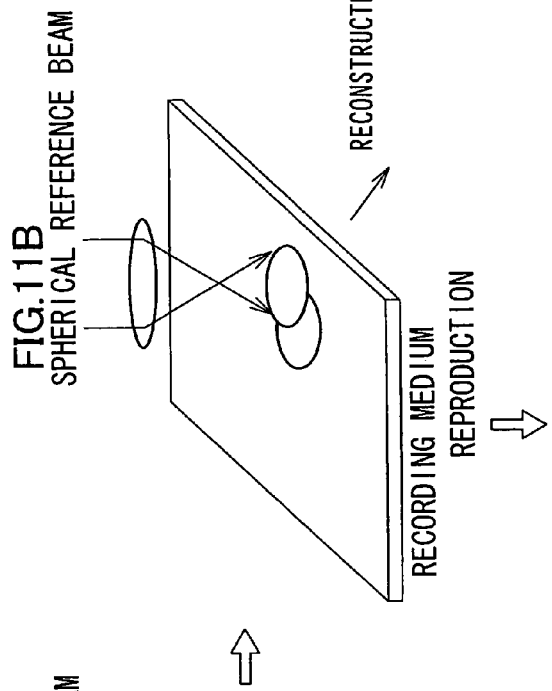
FIGS. 11A to 11C are diagrams of assistance in explaining a method for conducting re-recording in the same position as that in which a reproduced hologram has been recorded.
Figure 11B:
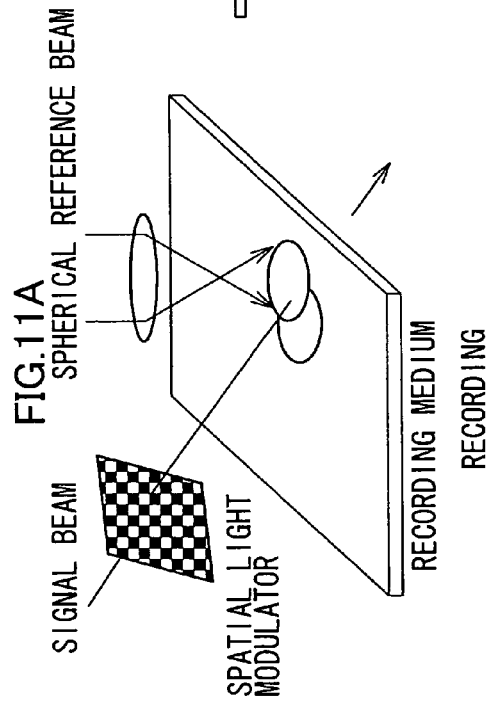
Figure 11C:
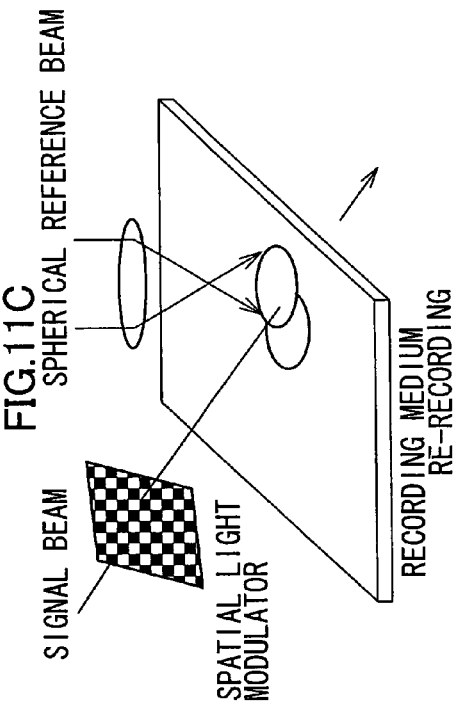

At step 206, laser light is applied. In addition, a recording signal of each page is output from the personal computer 42 at predetermined timing according to the exposure schedule. Shift multiplexing processing of the hologram onto the hologram recording medium is executed, and the processing routine is finished. In this case, the reproduced hologram is recorded again in the same position as that in which it has been recorded, as shown in FIGS. 11A to 11C.

As described above, the threshold (lower limit value) is previously set with respect to the intensity of the reconstructed beam. On the other hand, there is an upper limit in the intensity of the reconstructed beam which can be detected by the photo-detector 40. For example, if the intensity of the reconstructed beam is too great in the case where a CCD camera is used in the photo-detector 40, noise called blooming or smear is generated and the BER increases. Therefore, the maximum intensity of the reconstructed beam for which the BER does not exceed the permitted limit value becomes the upper limit. The difference between the lower limit and the upper limit of the reconstructed beam intensity is called readable latitude.

If re-recording is conducted according to the same exposure schedule and the read-out beam intensity is constant, the intensity of the reconstructed beam first reproduced from the re-recorded hologram becomes typically greater than the intensity of the reconstructed beam first reproduced from the original hologram after recording. Because there is a residual hologram caused by the original hologram in the recording region after re-recording. Therefore, the intensity of the reconstructed beam first reproduced from the first recorded hologram is set so as to get the intensity of the reconstructed beam first reproduced after re-recording in the range of the above-described readable latitude. This setting is conducted by adjusting the exposure schedule and the intensity of the read-out beam.

Figure 9:
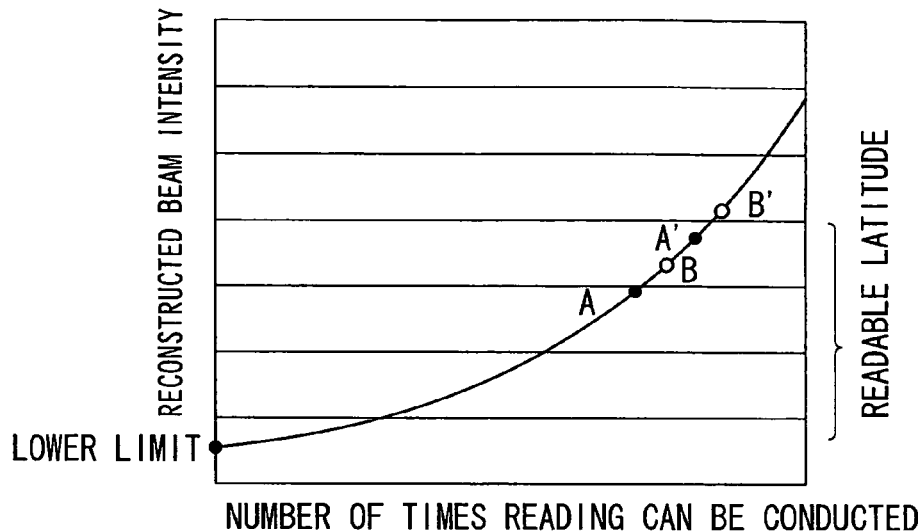
FIG. 9 is a diagram showing a relation between a reconstructed beam intensity before and after re-recording and a readable latitude.

For example, as shown in FIG. 9, the intensity of the reconstructed beam in the case where the first recorded hologram has been first reproduced is denoted by $I_{finit}$ (point A). As the number of times of reproduction increases (the number of readable times decreases), the intensity of the reconstructed beam from the hologram decreases. If the intensity becomes equal to the threshold (the lower limit value) or less, re-recording is executed. For example, supposing that reading can be conducted 100 times, the number of times reading can be conducted decreases by one whenever reproduction is conducted once. If reproduction has been conducted 100 times, further reading becomes impossible. If at the time of re-recording is conducted according to the same exposure schedule as that at the time of first recording, the intensity $I_{rinit}$ (point B) obtained when the re-recorded hologram has been first reproduced becomes slightly greater than the $I_{finit}$ because of the residual hologram in the recording region. Even in this case the intensity of the reconstructed beam is increased by re-recording, the point B is in the readable latitude and consequently the reproduction can be conducted without any problems.

On the other hand, if $I_{finit}$ is at a point A', which is slightly lower than the upper limit of the readable latitude, the intensity $I_{rinit}$ of the first reconstructed beam after the re-recording increases to a point B' and gets out of the readable latitude. In this time, the BER increases and consequently the re-recorded hologram cannot be read. Therefore, it is necessary to set $I_{finit}$ so as to get the intensity $I_{rinit}$ of the first reconstructed beam after the re-recording in the range of the readable latitude as represented by a point B. In the case where the exposure schedule is the same, the adjustment of the reconstructed beam intensity is conducted by the adjustment of the read-out beam intensity. For reducing the number of time of re-recording in the case of this example, the point A can be set by adjusting the read-out beam intensity so as to locate the point B' at the upper limit of the readable latitude.

By the way, when setting the exposure schedule, it is necessary to set the optimum $I_{finit}$ by previously taking the quantity of the reconstructed beam intensity increased by the re-recording into consideration. For reducing the number of times of re-recording, it is desirable to set the exposure schedule so as to locate $I_{rinit}$ at the maximum value of the readable latitude. Furthermore, it is also possible to set the exposure schedule for re-recording so as to always get the intensity of the reconstructed beam after re-recording in the readable latitude.

Figure 10:
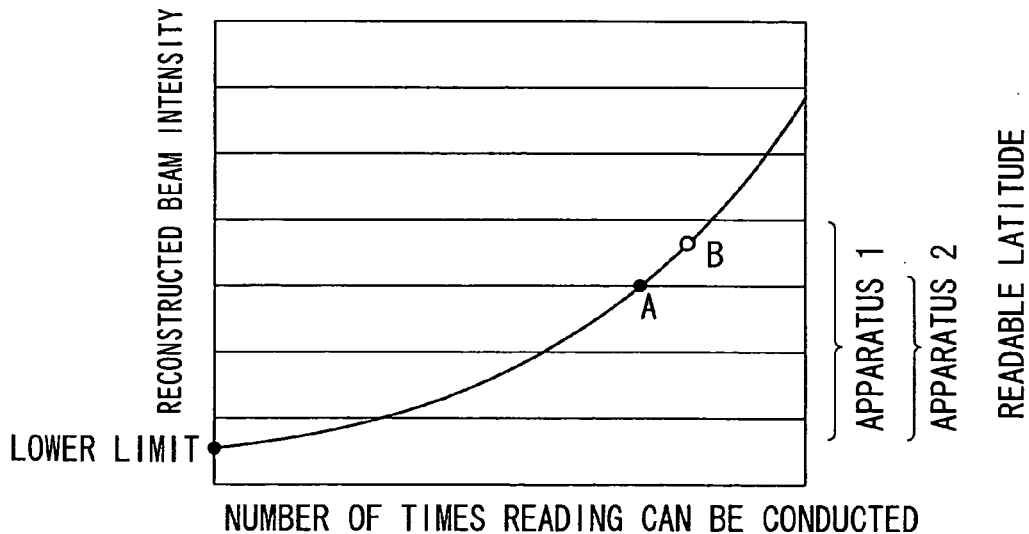
FIG. 10 is a diagram showing relations between a reconstructed beam intensity before and after re-recording and readable latitudes of two kinds.

There is a possibility that the readable latitude might differ according to the specifications of the photo-detector 40. In the case where the hologram recording medium is used as a portable recording medium, therefore, it is necessary to set $I_{finit}$ (point A) according to a photo-detector having a minimum readable latitude among photo-detectors supposed to be used. For example, it is supposed that two apparatuses 1 and 2 differing in readable latitude are used as shown in FIG. 10. The intensity $I_{rinit}$ (point B) of the reconstructed beam after re-recording is within the readable latitude of the apparatus 1, but it is outside the readable latitude of the apparatus 2. In the apparatus 2, therefore, data cannot be read suitably. For suitably reading data in both the apparatus 1 and the apparatus 2, it is necessary to set the position of the point A so as to get the point B in the readable latitude in both apparatuses.

If it is judged at the step 200 that re-recording should not be conducted in the same position, re-recording is to be conducted in a different position. At step 208, therefore, the FAT is searched for a vacant recording region. At step 210, the exposure schedule is read from the memory. At step 212, the drive unit 48 is driven to shunt the shutter 12 from the optical path so as to pass the laser beam. In addition, the stepping motor for the x-z stage 22 is driven by the drive unit 50 to rotate the hologram recording medium at the predetermined rotation speed.

At step 214, laser light is applied. In addition, a recording signal of each page is output from the personal computer 42 at predetermined timing according to the exposure schedule. Shift multiplexing processing of the hologram onto the hologram recording medium is executed, and the processing routine is finished. In this case, the reproduced hologram is recorded again in a position different from that in which it has been recorded, as shown in FIGS. 12A to 12C.

In the case where a file has been divided into a plurality of blocks and recorded, it is preferable to execute the defragmentation at the time of conducting re-recording in a different position.

Figure 13:
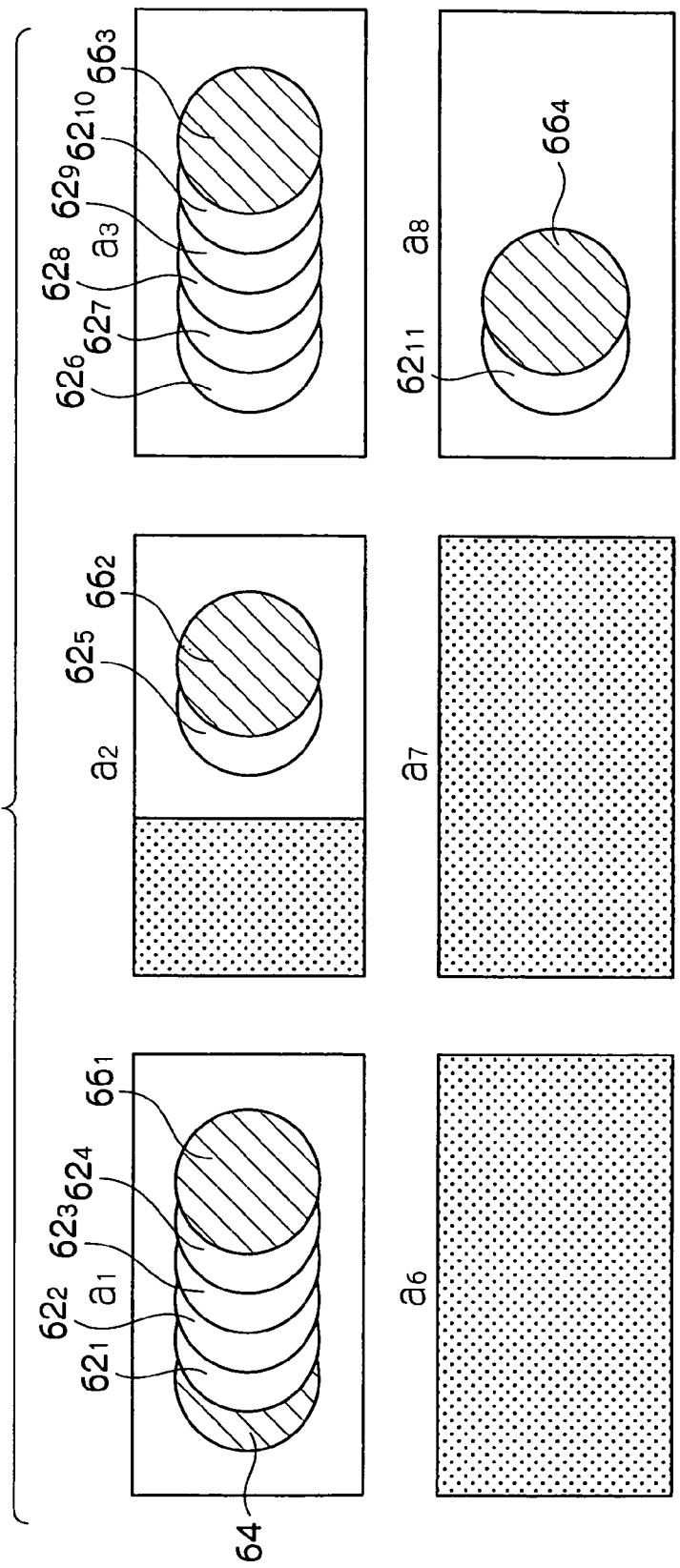
FIG. 13 is a concept diagram showing a state in which one file is divided into a plurality of blocks and recorded.
Figure 14:
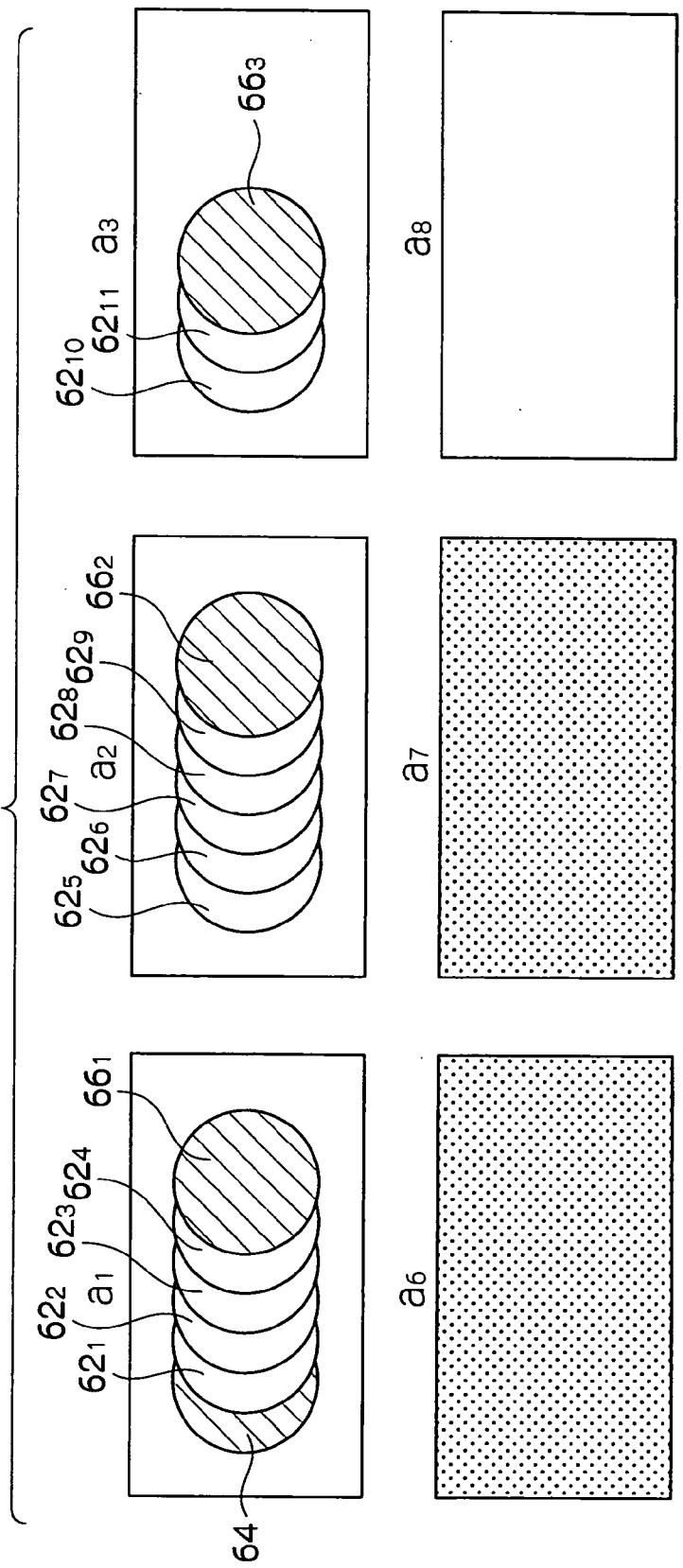
FIG. 14 is a concept diagram showing a state showing a state in which a file has been rearranged after defragmentation.

For example, it is supposed that one file formed of page data $62_1$ to $62_{11}$ corresponding to eleven pages has been recorded distributively in four recording regions $a_1$, $a_2$, $a_3$ and $a_8$ as shown in FIG. 13. If thereafter the use situation has changed, for example, another file in the recording region $a_2$ has been deleted as shown in FIG. 14, the file is rearranged accordingly. In this example, since another file in the recording region $a_2$ has been deleted, it becomes possible to divide the file into three parts and record them in three consecutive recording regions $a_1$, $a_2$ and $a_3$. Four pages, five pages and two pages are recorded in the recording regions $a_1$, $a_2$ and $a_3$, respectively. Fragmentation is thus eliminated.

In the case where a file is divided into a plurality of blocks, a page data 64 representing head information is added to a head page in a head block as shown in FIG. 13. Page data $66_1$ to $66_3$ each representing a recording region to be read subsequently are added to final pages in respective blocks. However, page data $66_4$ representing information to the effect that there is no block to be subsequently read is added to the final page in the end block. Even in the state of fragmentation, file reading is possible. At the time of reproduction, however, the movement quantity of the head or the recording medium increases and the file retrieval speed (seek time) is lowered. On the other hand, by executing defragmentation at the time of re-recording, the seek time is shortened.

As heretofore described, when data recorded as the hologram is degraded by read-out beam irradiation and the intensity of the detected reconstructed beam has fallen, the reproduced data is re-recorded as a hologram in the present embodiment. Therefore, it is avoided that the hologram cannot be read by repeating the reproduction, and data recorded as the hologram can be retained and reproduced stably.

By the way, the example in which the shift multiplexing is conducted by rotating the hologram recording medium has been described. However, the shift multiplexing may be conducted by moving the hologram recording medium in a straight line form. Alternatively, instead of rotating the hologram recording medium or moving it in a straight line form, the hologram recording medium may be scanned with the signal beam and the reference beam.

The embodiment in which the invention is applied to the shift multiplexing method has been described. However, the invention may be applied to the angular multiplexing method, the wavelength multiplexing method, or the phase multiplexing method as well.

Figure 15:
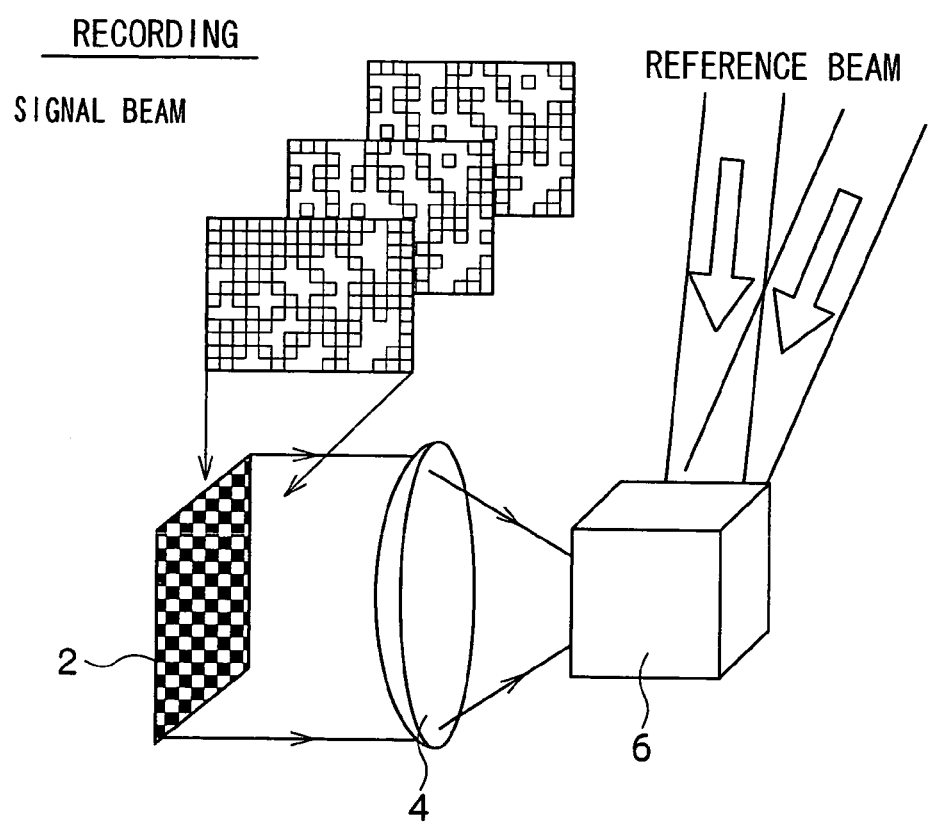
FIG. 15 is a diagram of assistance in explaining an angular multiplexing method, which is one of hologram multiplexing methods.

In the case where the invention is applied to the angular multiplexing method, the recording angle is changed at the time of hologram recording by applying the signal beam and the reference beam simultaneously to the optical recording medium while changing the angle formed by the reference beam with the signal beam by a predetermined angle θ as shown in FIG. 15. Information in the signal beam is thus recorded in the hologram recording medium as holograms of a plurality of pages. By the way, the example in which multiplexing is conducted by changing the angle of the reference beam has been described. However, multiplexing may be conducted by changing the angle of the signal beam with respect to the reference beam.

In the case where the invention is applied to the wavelength multiplexing method, the angle formed by the signal beam and the reference beam is made constant at the time of hologram recording. The signal beam and the reference beam are applied simultaneously to the optical recording medium while changing the wavelength of the signal beam and the reference beam by a predetermined wavelength $\Delta\lambda$. Information in the signal beam is thus recorded in the hologram recording medium as holograms of a plurality of pages.

In the case where the invention is applied to the phase multiplexing method, the angle formed by the signal beam and the reference beam is made constant at the time of hologram recording. The signal beam and the reference beam are applied simultaneously to the optical recording medium while changing the phase of the reference beam. Information in the signal beam is thus recorded in the hologram recording medium as holograms of a plurality of pages.

The example in which re-recording is conducted by using the signal beam and the reference beam each having the same polarization state as that at the time of the first recording has been described. However, if re-recording is conducted by using the signal beam and the reference beam each having a polarization state different from that at the time of the first recording so as to obtain a reconstructed beam having a polarization direction different from that at the time of the first recording, the variation in diffraction efficiency of the hologram between before and after the re-recording can be prevented. Furthermore, since the polarization direction of the obtained reconstructed beam is different from that in the first recorded hologram, the reconstructed beam from the re-recorded hologram can be easily separated and detected by using the analyzer or the like. In other words, re-recorded data can be reproduced without crosstalk.

What is claimed is:

1. A hologram retention method comprising:
reproducing information recorded as a first hologram in a predetermined position of an optical recording medium by irradiating a beam;
receiving a reconstructed beam diffracted from the first hologram;
determining whether an intensity of the reconstructed beam has decreased to a predetermined value or less; and
subsequently re-recording and retaining the reproduced information obtained from the reconstructed beam as a second hologram in the optical recording medium, without changing the reproduced information, when the intensity of the reconstructed beam has decreased to the predetermined value or less.

2. The method according to claim 1, wherein the subsequent re-recording and retaining includes re-recording the reproduced information as the second hologram in the same position on the optical recording medium as the predetermined position in which the first hologram is recorded.

3. A hologram retention method according to claim 2, wherein the subsequent re-recording and retaining includes recording position information representing the position in which the second hologram is recorded, with the reproduced information, in the second hologram.

4. A hologram retention method according to claim 2, wherein when re-recording the reproduced information as the second hologram in the same position on the optical recording medium as the predetermined position in which the first hologram is recorded, the reproduced information is re-recorded and retained so as to cause an intensity of a reconstructed beam to have a value that can be detected.

5. A hologram retention method according to claim 2, wherein the reconstructed beam diffracted from the first hologram has a first polarization state, and further comprising, when subsequently re-recording and retaining the reproduced information as the second hologram, changing a polarization state of a recording beam, so that the first polarization state is different from a second polarization state of a reconstructed beam obtained from the second hologram following the re-recording.

6. A hologram retention method according to claim 2, wherein the optical recording medium comprises a photorefractive material, a photochromic material or a polarization sensitive material.

7. A hologram retention method according to claim 2, wherein the optical recording medium comprises polyester having an azobenzene frame in its side chain.

8. The method according to claim 1, wherein the subsequent re-recording and retaining includes re-recording and retaining the reproduced information as the second hologram in a position on the optical recording medium different from the predetermined position in which the first hologram is re-recorded.

9. A hologram retention method according to claim 8, wherein the subsequent reproducing and retaining includes recording position information representing the position in which the second hologram is recorded, with the reproduced information, in the second hologram.

10. A hologram retention method according to claim 8, wherein the optical recording medium comprises a photorefractive material, a photochromic material or a polarization sensitive material.

11. A hologram retention method according to claim 8, wherein the optical recording medium comprises polyester having an azobenzene frame in its side chain.

12. A hologram retention method comprising:
   reproducing information recorded as a first hologram in a predetermined position of an optical recording medium;
   receiving a reconstructed beam diffracted from the first hologram;
   determining whether the number of times of reproduction of the information from the predetermined position has exceeded a predetermined value; and
   subsequently re-recording and retaining the reproduced information obtained from the reconstructed beam as a second hologram in the optical recording medium, without changing the reproduced information, when the number of times of reproduction has exceeded the predetermined value.

13. The method according to claim 12, wherein the subsequent re-recording and retaining includes re-recording the reproduced information as the second hologram in the same position on the optical recording medium as the predetermined position in which the first hologram is recorded.

14. The method according to claim 12, wherein the subsequent re-recording and retaining includes re-recording and retaining the reproduced information as the second hologram in a position on the optical recording medium different from the predetermined position in which the first hologram is recorded.

* * * * *